(12) United States Patent
Kim et al.

(10) Patent No.: US 8,153,339 B2
(45) Date of Patent: Apr. 10, 2012

(54) MASK AND MANUFACTURING METHOD OF A SEMICONDUCTOR DEVICE AND A THIN FILM TRANSISTOR ARRAY PANEL USING THE MASK

(75) Inventors: Jong-An Kim, Suwon-si (KR);
Ji-Haeng Han, Gunpo-si (KR);
Young-Bae Jung, Suwon-si (KR);
Bae-Hyoun Jung, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/823,030

(22) Filed: Jun. 24, 2010

(65) Prior Publication Data

US 2010/0261102 A1     Oct. 14, 2010

Related U.S. Application Data

(62) Division of application No. 12/258,228, filed on Oct. 24, 2008, now Pat. No. 7,767,506, which is a division of application No. 11/300,761, filed on Dec. 14, 2005, now Pat. No. 7,449,352.

(30) Foreign Application Priority Data

Dec. 14, 2004 (KR) .................. 10-2004-0105547
Jun. 10, 2005 (KR) .................. 10-2005-0049614

(51) Int. Cl.
*G03F 1/00* (2012.01)

(52) U.S. Cl. .......................................... 430/5

(58) Field of Classification Search .............. 430/5, 322, 430/323, 324
See application file for complete search history.

(56) References Cited

U.S. PATENT DOCUMENTS

| | | | |
|---|---|---|---|
| 5,543,252 A | 8/1996 | Shibata et al. | |
| 5,902,493 A | 5/1999 | Bae | |
| 5,916,712 A | 6/1999 | Miyashita et al. | |
| 6,217,422 B1 | 4/2001 | Franca et al. | |
| 6,300,035 B1 | 10/2001 | Tackeray et al. | |
| 6,440,616 B1 * | 8/2002 | Izuha et al. | 430/5 |
| 6,869,736 B2 | 3/2005 | Nakagawa et al. | |
| 7,371,483 B2 * | 5/2008 | Kanamitsu et al. | 430/5 |
| 2002/0044229 A1 | 4/2002 | Kim | |
| 2002/0145711 A1 | 10/2002 | Magome et al. | |
| 2004/0266041 A1 | 12/2004 | Kim | |
| 2007/0064185 A1 | 3/2007 | Kim et al. | |

FOREIGN PATENT DOCUMENTS

| | | |
|---|---|---|
| CN | 1423168 A | 6/2003 |
| CN | 1525224 A | 9/2004 |
| JP | 01-130148 A | 5/1989 |
| JP | 7-043888 | 2/1995 |
| JP | 8-106151 | 4/1996 |
| JP | 8-272073 | 10/1996 |
| JP | 9-061990 | 3/1997 |
| JP | 10-083062 | 3/1998 |
| JP | 10-148926 | 6/1998 |
| JP | 2000-133562 A | 5/2000 |
| JP | 2002-189281 A | 7/2002 |

(Continued)

*Primary Examiner* — Stephen Rosasco
(74) *Attorney, Agent, or Firm* — Innovation Counsel LLP

(57) ABSTRACT

An exposure mask is provided, which includes: a light blocking opaque area blocking incident light; a translucent area; and a transparent area passing the most of incident light, wherein the translucent area generates the phase differences in the range of about −70° to about +70°.

7 Claims, 21 Drawing Sheets

FOREIGN PATENT DOCUMENTS

| | | |
|---|---|---|
| JP | 2003-177506 A | 6/2003 |
| JP | 2003-195479 | 7/2003 |
| JP | 2004-046223 A | 2/2004 |
| JP | 2004-333653 A | 11/2004 |
| JP | 2006-146151 A | 6/2006 |
| KR | 1019980010601 | 4/1998 |
| KR | 1019980033964 | 8/1998 |
| KR | 1019980068443 | 10/1998 |
| KR | 1020000041410 | 7/2000 |
| KR | 1020000057061 A | 9/2000 |
| KR | 1020010075777 | 8/2001 |
| KR | 1020020065081 | 8/2002 |
| KR | 1020030080373 A | 10/2003 |
| KR | 1020030084781 | 11/2003 |
| KR | 1020040019601 | 3/2004 |
| KR | 1020040033851 A | 4/2004 |
| KR | 1020040035486 | 4/2004 |
| KR | 1020040068863 | 8/2004 |
| WO | 2004/021082 A2 | 3/2004 |

* cited by examiner

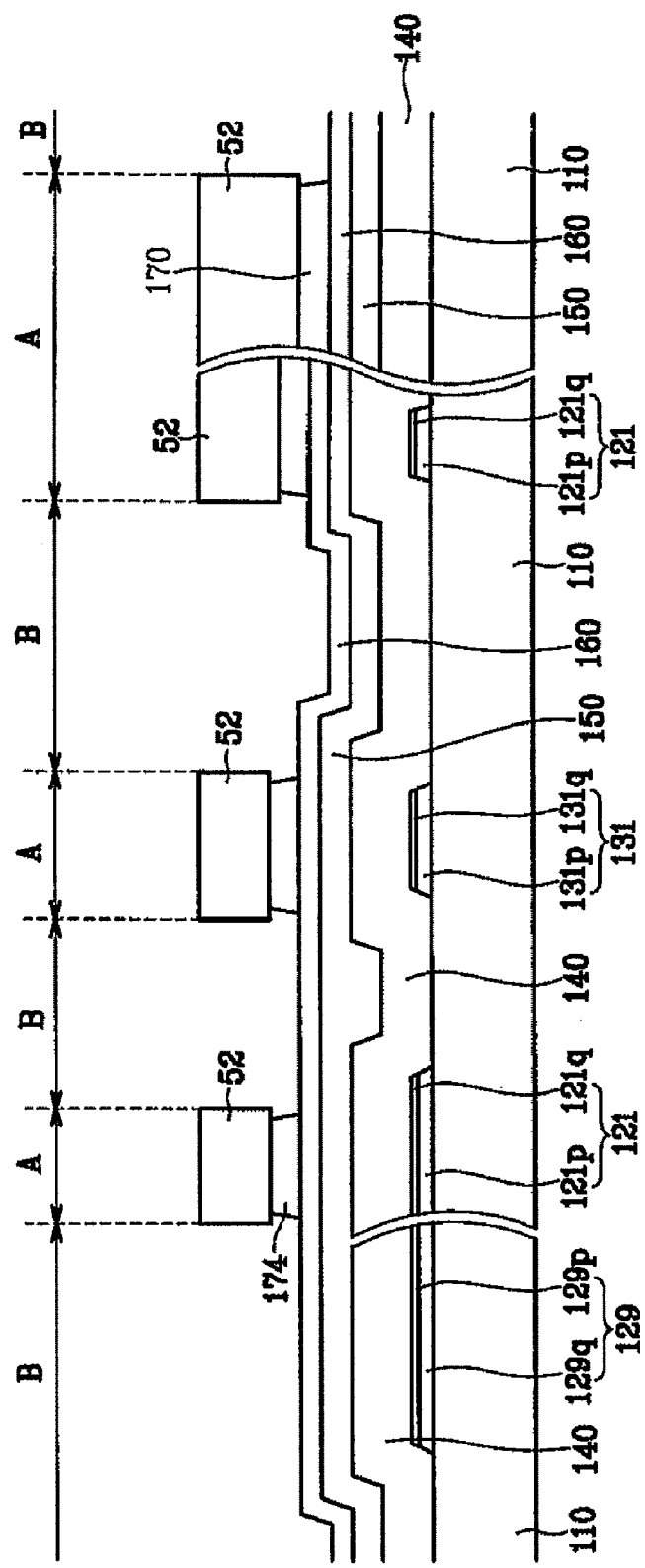

MASK AND MANUFACTURING METHOD OF A SEMICONDUCTOR DEVICE AND A THIN FILM TRANSISTOR ARRAY PANEL USING THE MASK

CROSS-REFERENCE TO RELATED APPLICATIONS

This application is a Divisional application of U.S. patent application Ser. No. 12/258,228, filed Oct. 24, 2008, which is a Divisional application of U.S. patent application Ser. No. 11/300,761, now U.S. Pat. No. 7,449,352, which claims priority from Korean Patent Applications No. 10-2004-0105547 filed on Dec. 14, 2004, and No. 10-2005-0049614 filed on Jun. 10, 2005, the contents of each of which are herein incorporated by reference in their entireties and for all purposes.

BACKGROUND (a) Field of the Invention

The present invention relates to a mask for processing of thin films using photolithography and a method for using such as a mask for manufacturing semiconductor devices, such as a thin film transistor array panel.

(b) Description of Related Art

Recently, flat panel displays (e.g., liquid crystal displays (LCD's), organic light emitting diode (OLEDD) displays and plasma display panels (PDP's) are replacing heavy and large cathode ray tubes (CRT's) in many applications.

To display an image, a PDP uses plasma from a gas discharge, an OLEDD excites an emissive organic or polymer material to emit light, and an LCD generates in the liquid crystal (LC) layer an electric field, which determines the orientations of the LC molecules in the LC layer. The orientation of the LC molecules controls the transmittance of light incident on the LC layer.

A flat display device typically includes a lower panel that is provided with a plurality of pixels arranged in a matrix. Each pixel in the matrix includes a switching element, which is connected to a plurality of signal lines which transmit signals to the switching elements in the matrix. Opposite this lower panel is an upper panel that is provided with a plurality of color filters. The flat display device also has a plurality of driving elements which drive signals to the signal lines.

Multilayered thin films are patterned on these panels using photolithography and etching steps to form the signal lines and contact holes in the insulating layers. Since photolithography is costly and time-consuming, it is desirable to reduce the number of lithography steps.

SUMMARY OF THE INVENTION

The present invention provides a technique for patterning one or more layers of thin films using a photoresist etch mask which is provided one or more thinner portions. As disclosed herein, the photoresist etch mask protects portions of one or more layers from being etched, while exposed portions of the layers are etched. Subsequently, an "etch back" process completely removes the thin portion, to expose the portions of the layers underneath the thin layer, while leaving the thicker portions of the photoresist etch mask to protect other portions of the layers. Accordingly, the thin portions of the photoresist etch mask are provided a uniform thickness to allow them to be completely removed in the etch back process.

According to one embodiment of the present invention, an exposure mask is provided, which includes: a light blocking opaque area blocking incident light; a transparent area which allows most of the incident light to pass; and a translucent area that generates a phase difference between about −70° to +70° in the light passing through it. The transmittance of the translucent area may be between 20-40% of the transmittance of the transparent area. The translucent area may include molybdenum silicon (MoSi).

The light blocking opaque area may include an opaque material, such as chromium (Cr).

According to an embodiment of the present invention, a method for manufacturing a semiconductor device using the exposure mask is also provided, which includes: coating a photoresist on a substrate having at least two thin films; exposing and developing the photoresist using the exposure mask so as to form a photoresist pattern having a first portion and a second portion which is thicker than the first portion; and etching both thin films using the photoresist pattern as an etch mask.

The semiconductor device thus manufactured may be used in a display panel such as an LCD, an OLEDD.

According to one embodiment of the present invention, a method for manufacturing a thin film transistor array panel is also provided, which includes: forming a gate line including a gate electrode; forming a gate insulating layer on the gate line; forming a semiconductor layer on the gate insulating layer; forming a data line and a drain electrode on the semiconductor layer; depositing a passivation layer over the data line and the drain electrode; and forming a pixel electrode connected to the drain electrode, wherein the semiconductor layer, the data line, and the drain electrode are etched using an exposure mask in a photolithography process, and wherein the exposure mask includes: a translucent area generating a phase difference in the incident light in the range of about −70° to +70°, a light blocking opaque area. The light blocking opaque area faces the data line and the drain electrode.

According to another embodiment of the present invention, a photoresist pattern having a first portion and a second portion that is thicker than the first portion are formed in the photolithography process using an exposure mask. The first and the second portions respectively face a channel area between a source electrode and a drain electrode, and a wire area on the data line and the drain electrode.

The wire area and the channel area may be respectively aligned to the light blocking opaque area and the translucent area in the photolithography process.

The method may further include forming ohmic contacts between the semiconductor layer and designated portions of the data line and the drain electrode.

A process for forming the data line and the drain electrode, the ohmic contacts, and the semiconductor layer may include: depositing an intrinsic silicon layer, an extrinsic silicon layer, and a conductor layer; forming a photoresist etch mask including a first portion for protecting a channel area between a source electrode and a drain electrode, and a second portion for protecting wire areas on the data line and the drain electrode, and the second portion being thicker than the first portion; etching the conductor layer outside of the photoresist etch mask; removing the first portion of the photoresist etch mask to expose the conductor layer over the channel area; etching the silicon layer and the doped silicon layer in the area outside of the photoresist etch mask; etching the conductor layer and the extrinsic silicon layer in the channel area; and removing the second portion photoresist.

BRIEF DESCRIPTION OF THE DRAWINGS

The present invention is illustrated by embodiments thereof set forth below in detail with reference to the accompanying drawings in which:

FIGS. 7A and 7B are sectional views of the TFT array panel shown in FIG. 4 taken along the lines VA-VA' and VB-VB', respectively, and illustrate a step following the step shown in FIGS. 6A and 6B;

DETAILED DESCRIPTION OF EMBODIMENTS

Figure 1:
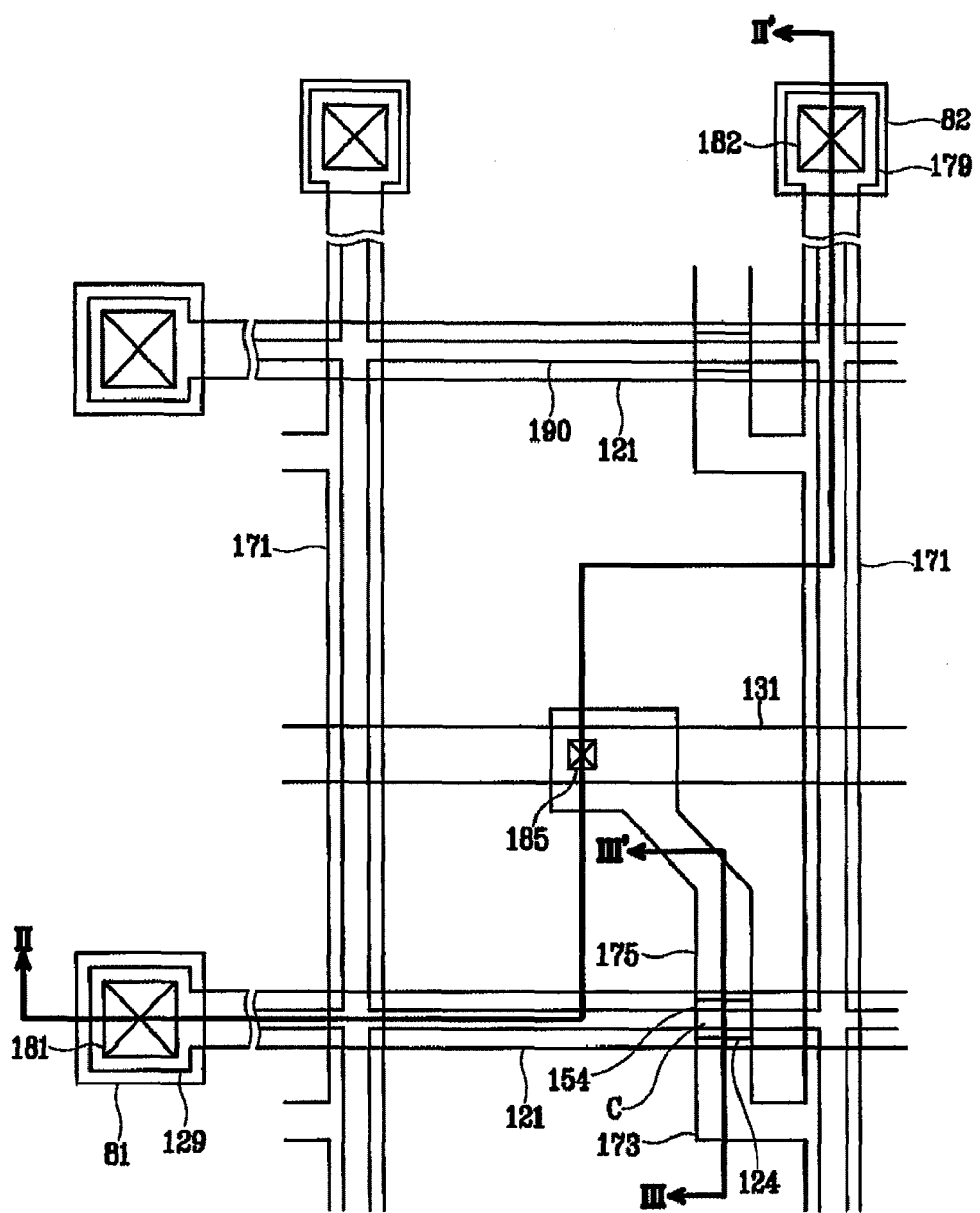
FIG. 1 is a layout view of a TFT array panel for an LCD according to an embodiment of the present invention.

The present invention is now described by way of illustrative embodiments in detail with reference to the accompanying drawings. Like numerals refer to like elements throughout.

In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
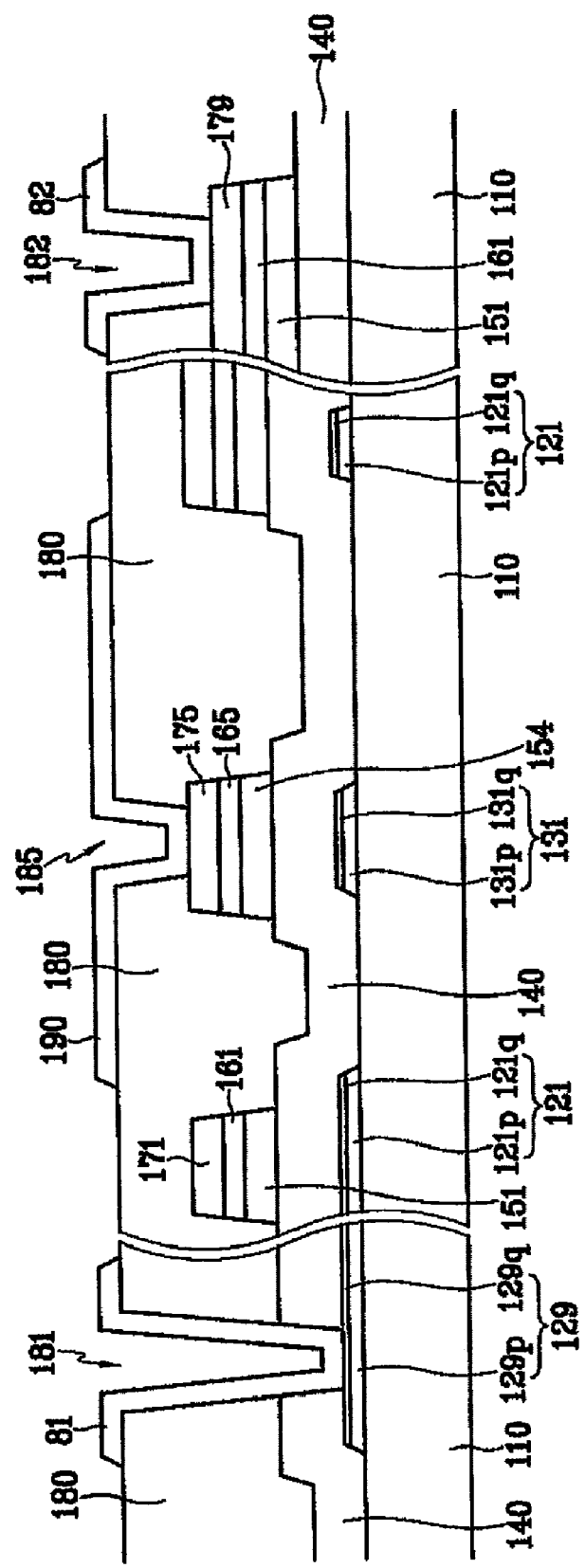
FIGS. 2 and 3 are sectional views of the TFT array panel shown in FIG. 1 taken along the lines II-II' and III-III', respectively.
Figure 3:
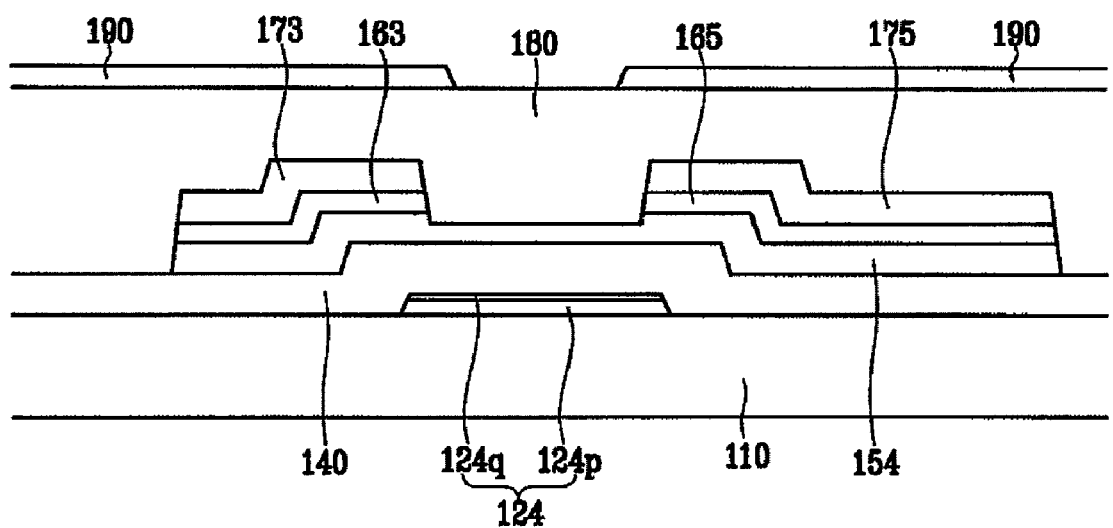

FIGS. 1-3 show a TFT array panel for an LCD according to one embodiment of the present invention. FIG. 1 is a layout view of the TFT array panel, and FIGS. 2 and 3 are sectional views of the TFT array panel taken along the lines II-II' and III-III' in FIG. 1, respectively.

As shown in FIGS. 1-3, a plurality of gate lines 121 and a plurality of storage electrode lines 131 are formed on an insulating substrate 110 (e.g., transparent glass). The gate lines 121, which transmit gate signals, extend substantially in a transverse direction Each gate line 121 includes a plurality of portions each forming a gate electrode 124, and an end portion 129 having a large area for contact with another layer or an external driving circuit. The driving circuit may be integrated on the insulating substrate 110.

Each storage electrode line 131 is separated from the two gate lines 121 on either side of it and extends substantially in the transverse direction. Each storage electrode line 131 is supplied with a predetermined voltage (e.g., the common voltage of another panel (not shown)). The storage electrode lines 131 may include a plurality of expansions each having a large area, and may be placed close to a corresponding gate line 121 to enhance an aperture ratio.

The gate lines 121 and the storage electrode lines 131 are preferably made of metal (e.g., Al, an Al alloy, Ag, a Ag alloy, Cu, a Cu alloy, Mo, a Mo alloy, Cr, Ti or Ta). As shown in FIG. 2, the gate lines 121 each include two films having different physical characteristics: a lower film $121p$ and an upper film $121q$. The upper film $121q$ is preferably made of a low resistivity metal (e.g., Al or an Al alloy) to reduce both signal delay and the voltage drop in the gate lines 121. The upper film $121q$ may be 1,000-3,000 Å thick. On the other hand, the lower film $121p$ is preferably made of a material such as Cr, Mo or a Mo alloy, which has good physical, chemical, and electrical contact characteristics with materials such as indium tin oxide (ITO), or indium zinc oxide (IZO). The lower film $121p$ may be 100-1,000 Å thick. In one embodiment, Mo is used for the lower film, and an Al—Nd alloy is used for the upper film. Alternatively, the Al—Nd alloy may be used for the lower film and Mo may be used for the upper film.

In FIGS. 2 and 3, the lower and the upper films of the gate electrodes 124 are indicated by reference numerals $124p$ and $124q$, respectively, while the lower and the upper films of the end positions 129 are indicated by reference numerals $129p$ and $129q$, [*Note: p and q are labeled backwards in FIG. 2*, we have amended] respectively. The lower and the upper films of the storage electrode lines 131 are indicated by reference numerals $131p$ and $131q$, respectively. Portions of the upper film $129q$ of the end portions 129 of the gate lines 121 may be removed to expose the underlying portions of the lower films $129p$.

In addition, the lateral sides of the upper film $121q$, $124q$, $129q$ and $131q$, and the lower film $121p$, $124p$, $129p$ and $131p$ may be formed tapered, and the inclination angle of the lateral sides with respect to a surface of the substrate 110 may be between about 30 and about 80 degrees.

A gate insulating layer 140, preferably made of silicon nitride (SiNx), is formed on the gate lines 121 and the storage electrode lines 131.

A plurality of semiconductor stripes 151, preferably made of hydrogenated amorphous silicon (abbreviated to "a-Si"), are formed on the gate insulating layer 140. Each semiconductor stripe 151 extends substantially in a longitudinal direction and has a plurality of projections 154 branched out toward the gate electrodes 124.

A plurality of ohmic contact stripes 161 and ohmic contact islands 165, each preferably made of a silicide or an n+ hydrogenated a-Si heavily doped with n-type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 may be formed tapered at an inclination angle preferably between about 30 to about 80 degrees.

A plurality of data lines 171 and a plurality of drain electrodes 175 are formed on the ohmic contacts 161 and 165.

The data lines 171, which transmit data voltages, extend substantially in the longitudinal direction and intersect the gate lines 121. The data lines 171 include a plurality of end portions 179 each having a large area for contact with another layer or an external driving circuit. A plurality of branches of each data line 171 which project toward the drain electrodes 175 form a plurality of source electrodes 173. Each pair of the source electrodes 173 and the drain electrodes 175 are separated from each other by an area above a gate electrode 124. A gate electrode 124, a source electrode 173, and a drain electrode 175 along with a projection 154 of a semiconductor stripe 151 form a thin film transistor (TFT) having a channel formed in the projection 154 disposed between the source electrode 173 and the drain electrode 175.

The data lines 171 and the drain electrodes 175 are preferably made of a metal such as Al, an Al alloy, Ag, an Ag alloy, Cu a Cu alloy, Mo, a Mo alloy, Cr, Ti or Ta. In addition, the data lines 171 and the drain electrodes 175 may each have be single-layered or multi-layered. In this embodiment, the data lines 171 and the drain electrodes 175 are made of Mo or Mo alloy as a single layer.

Like the gate lines 121, the data lines 171 and the drain electrodes 175 have tapered lateral sides, and the inclination angles thereof range from about 30 to about 80 degrees.

The ohmic contacts 161 are interposed only between the underlying semiconductor stripes 151 and the overlying data lines 171, while the ohmic contacts 165 are interposed only between the projections 154 and the overlying drain electrodes 175 thereon. The ohmic contacts serve to reduce the contact resistance of the materials they connect.

Also, the semiconductor stripes 151 of the TFT array panel according to this embodiment have almost the same planar shapes as the data lines 171, the drain electrodes 175, and the underlying ohmic contacts 161 and 165. However, the projections 154 of the semiconductor stripes 151 include some exposed portions, which are not covered by the data lines 171 or the drain electrodes 175, such as those portions located between the source electrodes 173 and the drain electrodes 175.

A passivation layer 180 is formed on the data lines 171, the drain electrodes 175, and the exposed portions of the semiconductor stripes 151. The passivation layer 180 is preferably made of an inorganic insulator such as silicon nitride or silicon oxide, photosensitive organic material having a good flatness characteristic, or low dielectric insulating material such as a-Si:C:O and a-Si:O:F formed by plasma enhanced chemical vapor deposition (PECVD). The passivation layer 180 may have a double-layered structure including a lower inorganic film and an upper organic film.

The passivation layer 180 has a plurality of contact holes 185 and 182 exposing the drain electrodes 175, and end portions 179 of the data lines 171, respectively. The passivation layer 180 and the gate insulating layer 140 have a plurality of contact holes 182 exposing end portions 129 of the gate lines 121.

A plurality of pixel electrodes 190 and a plurality of contact assistants 81 and 82, which are preferably made of IZO or ITO, are formed on the passivation layer 180.

The pixel electrodes 190 are physically and electrically connected to the drain electrodes 175 through the contact holes 185 such that the pixel electrodes 190 receive the data voltages from the drain electrodes 175.

The electric fields generated across the pixel electrodes 190 and the common electrode on the other panel (not shown) by the data voltages reorient liquid crystal molecules in the liquid crystal layer. Thus, the pixel electrodes 190, the liquid crystal layer, and the common electrode forms a liquid crystal capacitor which stores an applied voltage after the TFT turns off. An additional capacitor, called a "storage capacitor," is connected in parallel to the liquid crystal capacitor to enhance the voltage storing capacity. The storage capacitors may be implemented by allowing the pixel electrodes 190 overlap the adjacent gate lines 121 (called "previous gate lines") or the storage electrode lines 131.

Optionally, the pixel electrodes 190 may overlap the gate lines 121 and the data lines 171 to increase the aperture ratio.

The contact assistants 81 and 82 are connected to the exposed end portions 129 of the gate lines 121 and the exposed end portions 179 of the data lines 171 through the contact holes 181 and 182, respectively. The contact assistants 81 and 82 are not required, but their presence protects the exposed portions 129 and 179 and facilitates the exposed portions 129 and 179 adhere to external devices.

According to another embodiment of the present invention, the pixel electrodes 190 are made of transparent conductive polymer. For a reflective LCD, the pixel electrodes 190 may be made of an opaque reflective metal. The contact assistants 81 and 82 may be made of a material such as IZO or ITO, which is different from the material used to make the pixel electrodes 190.

A method of manufacturing the TFT array panel shown in FIGS. 1 to 3 according to an embodiment of the present invention is next described in detail with reference to FIGS. 4 to 13B, as well as to FIGS. 1-3.

Figure 4:
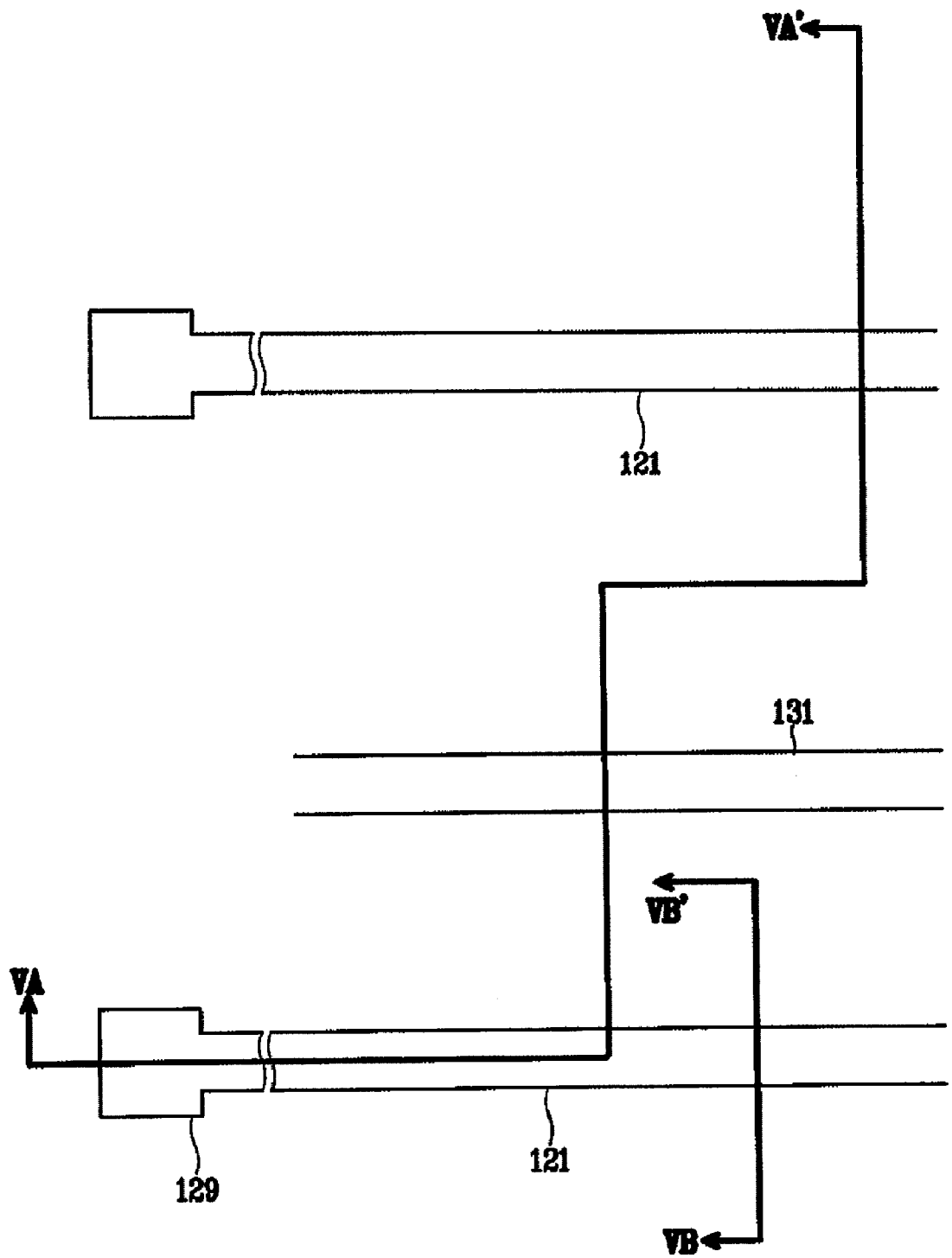
FIG. 4 is a layout view of a TFT array panel shown in FIGS. 1-3 in a first step of a manufacturing method thereof according to an embodiment of the present invention.
Figure 5A:
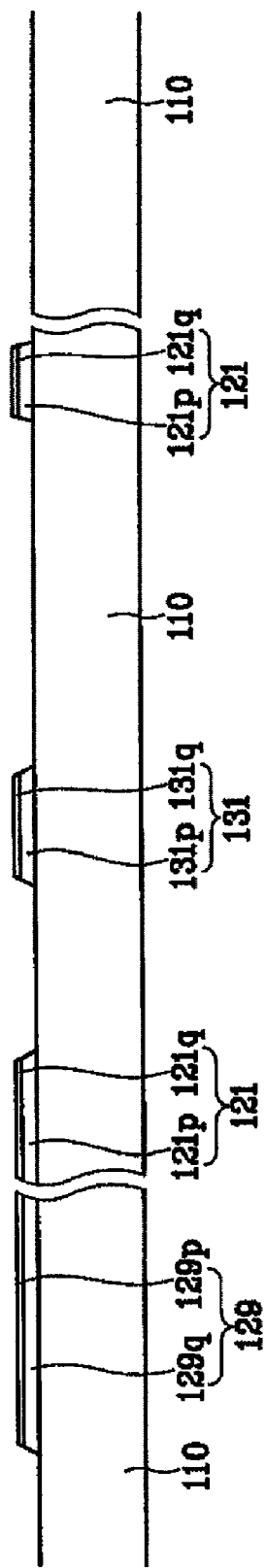
FIGS. 5A and 5B are sectional views of the TFT array panel shown in FIG. 4 taken along the lines VA-VA' and VB-VB', respectively.
Figure 5B:
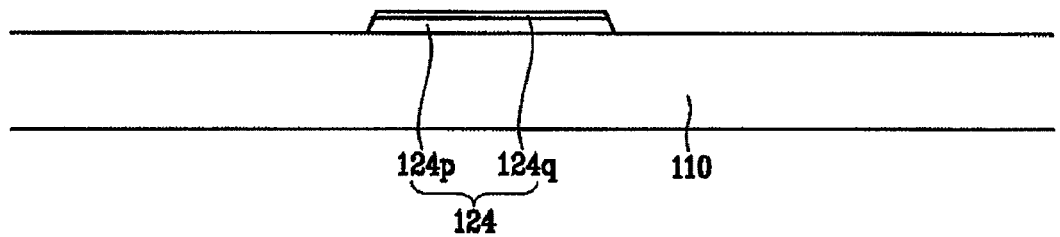
Figure 6A:
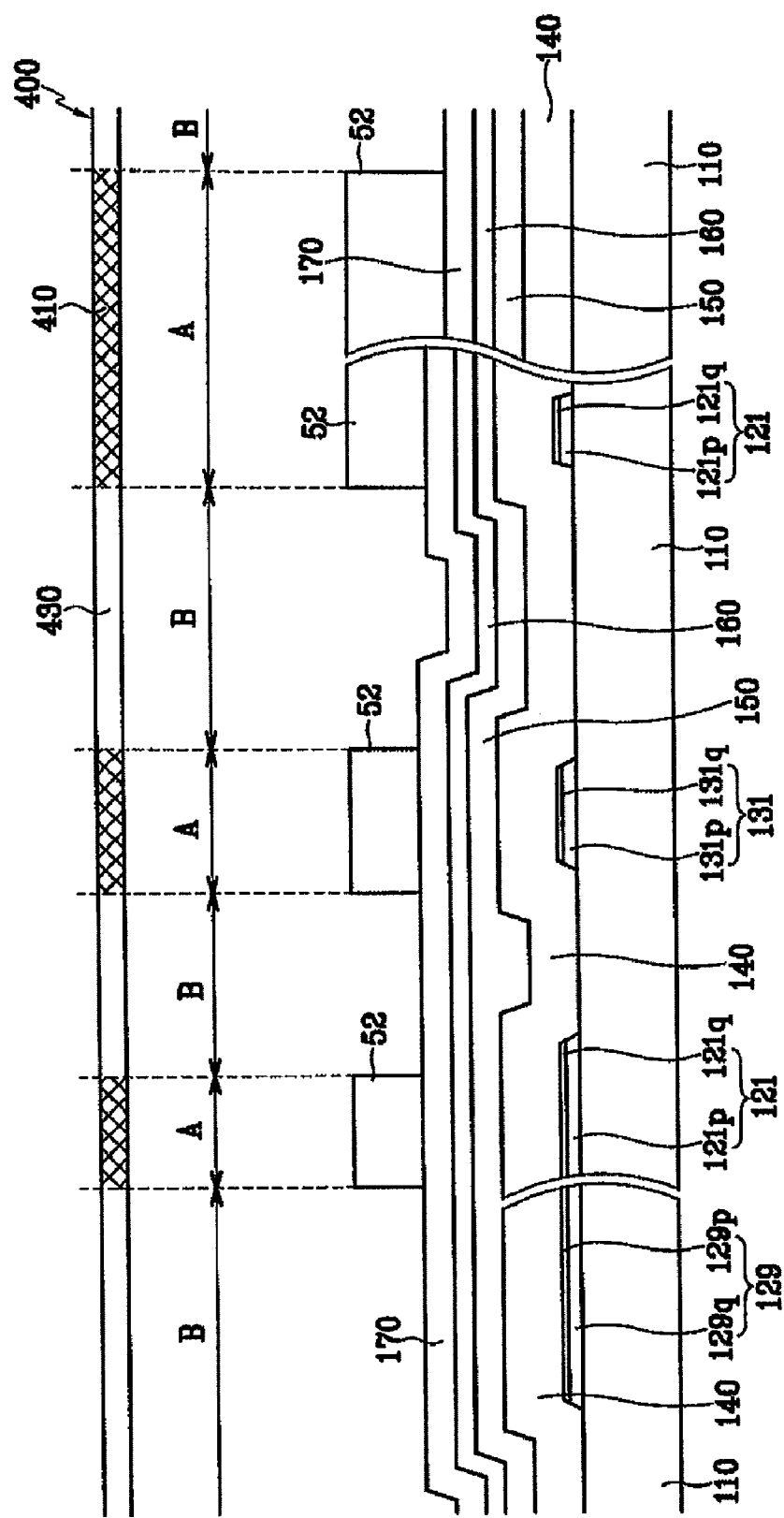
FIGS. 6A and 6B are sectional views of the TFT array panel shown in FIG. 4 taken along the lines VA-VA' and VB-VB', respectively, and illustrate a step following the step shown in FIGS. 5A and 5B.
Figure 6B:
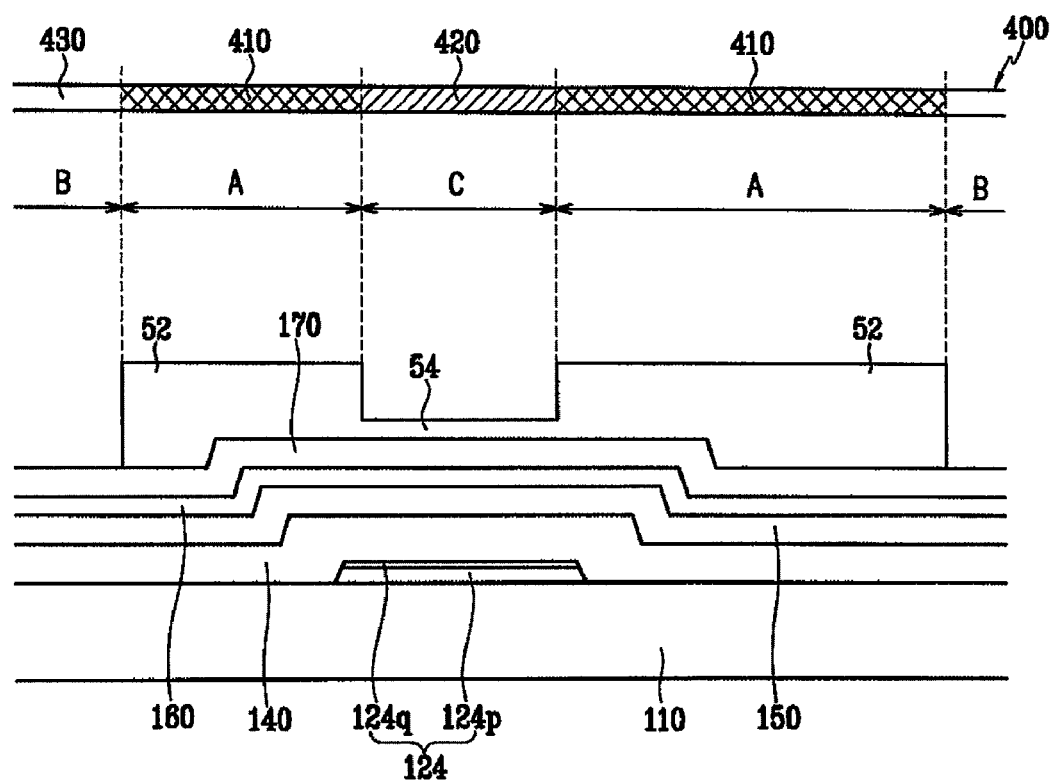
Figure 7B:
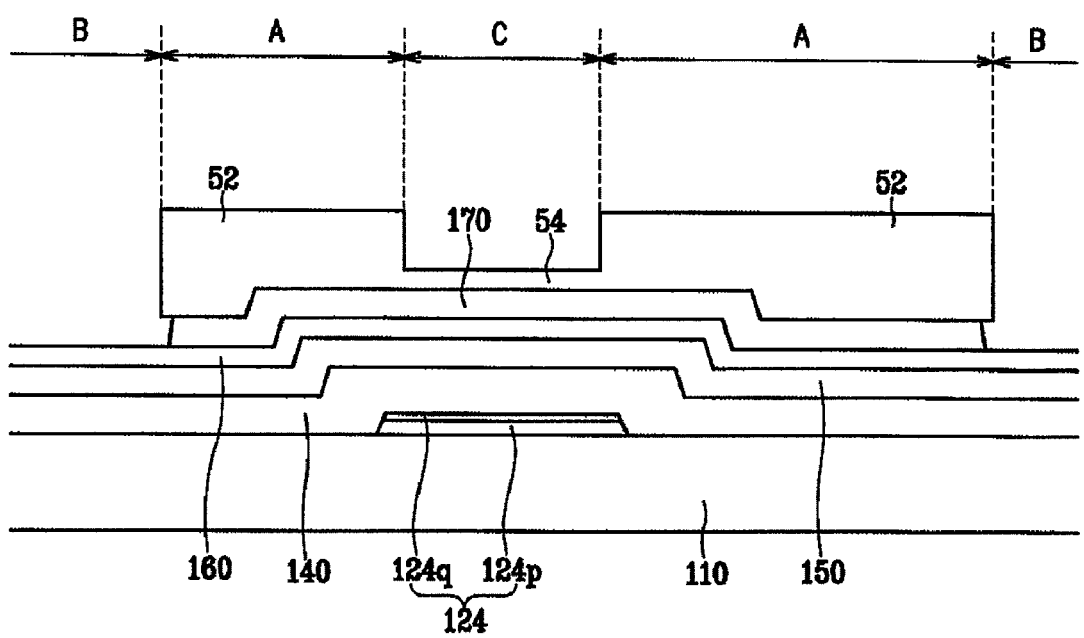
Figure 9A:
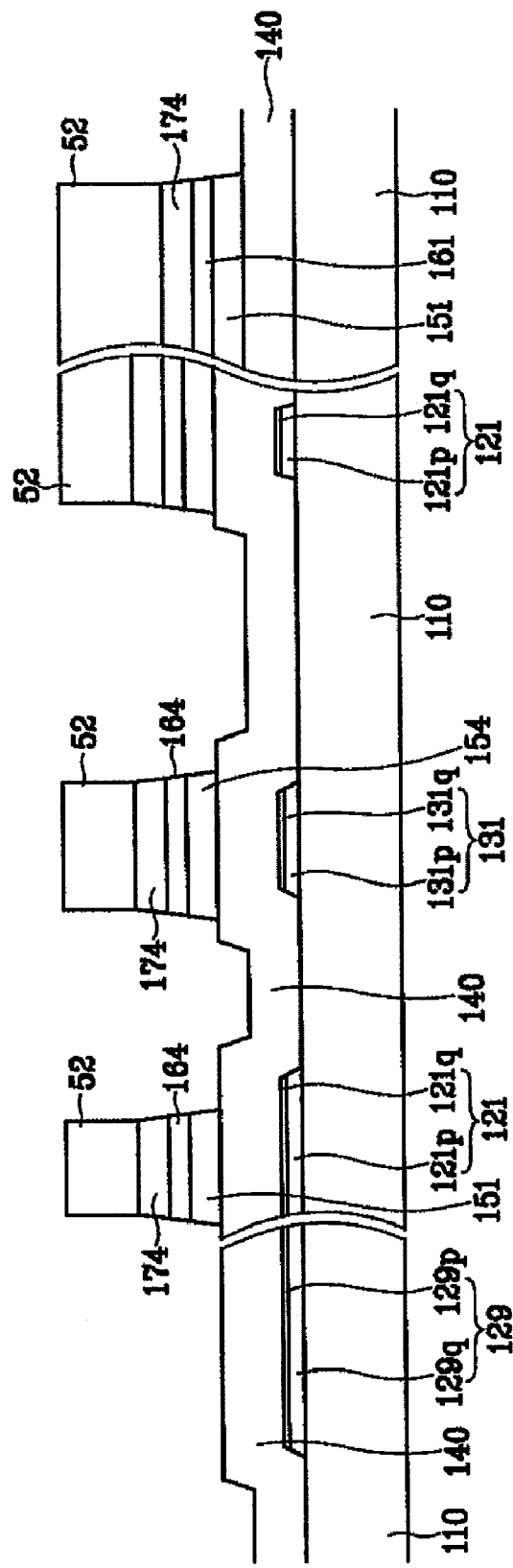
FIGS. 9A and 9B are sectional views of the TFT array panel shown in FIG. 4 taken along the lines VA-VA' and VB-VB', respectively, and illustrate a step following the step shown in FIGS. 8A and 8B.
Figure 9B:
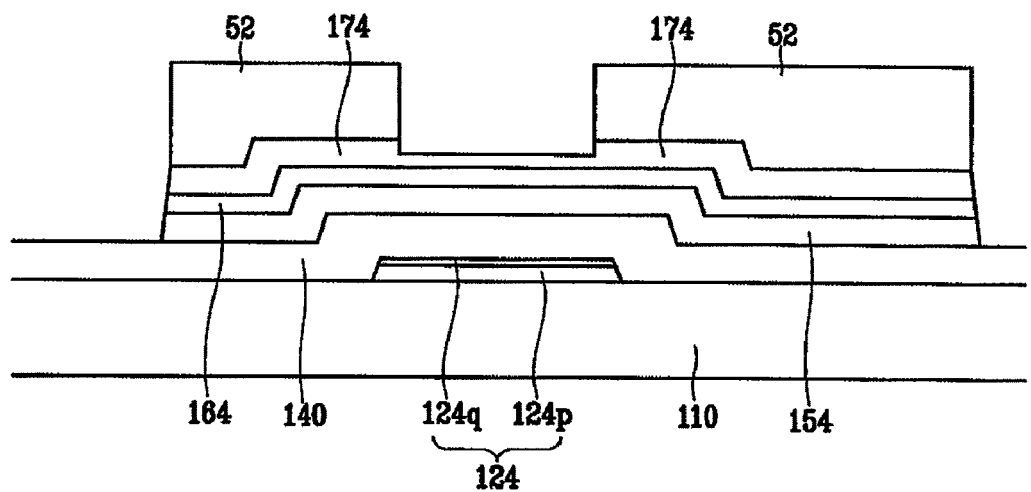
Figure 10:
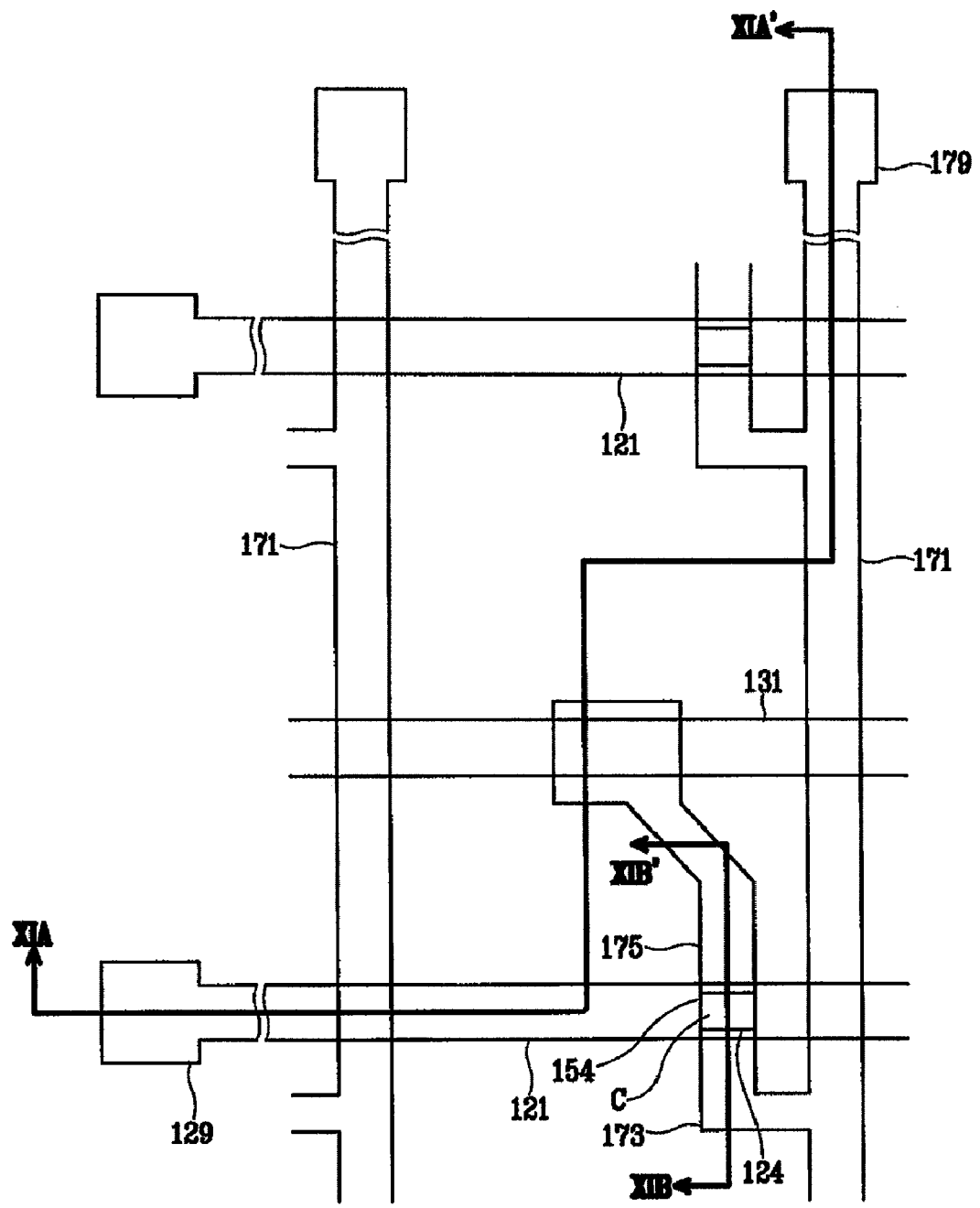
FIG. 10 is a layout view of the TFT array panel in a step following the step shown in FIGS. 9A and 9B.
Figure 11A:
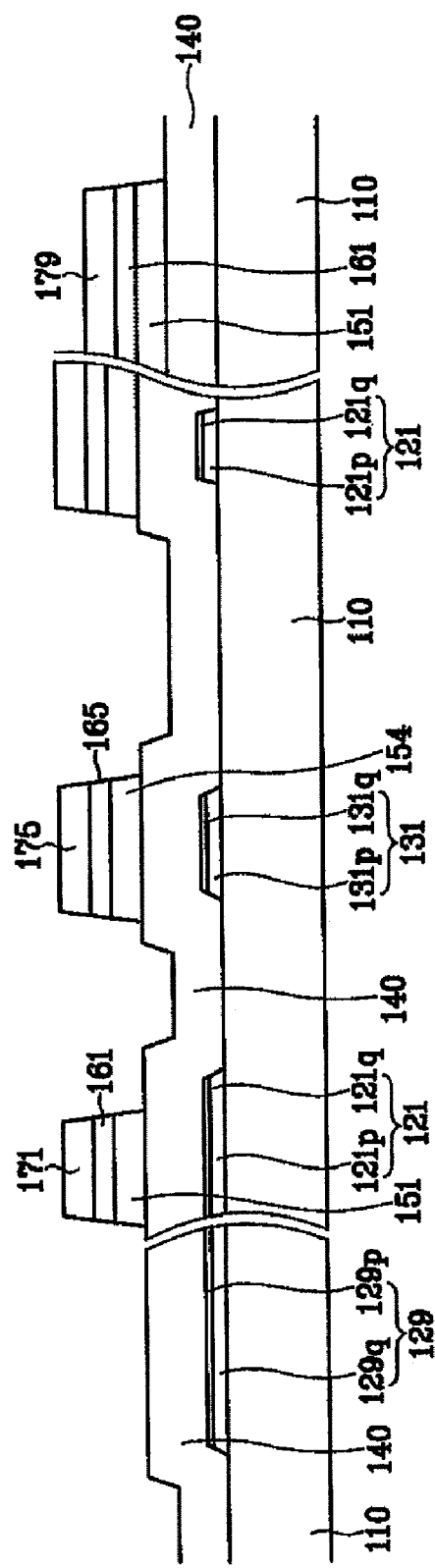
FIGS. 11A and 11B are sectional views of the TFT array panel shown in FIG. 10 taken along the lines XIA-XIA' and XIB-XIB', respectively.
Figure 11B:
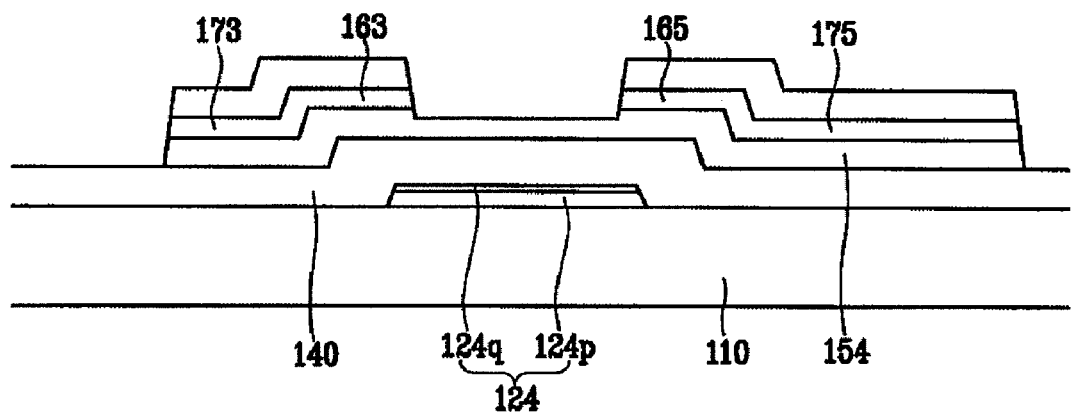

FIG. 4 is a layout view of a TFT array panel shown in FIGS. 1-3 in a first step of a method for manufacturing such an array, according to an embodiment of the present invention. FIGS. 5A and 5B are sectional views of the TFT array panel shown in FIG. 4 taken along the lines VA-VA' and VB-VB', respectively. FIGS. 6A and 6B are sectional views of the TFT array panel shown in FIG. 4 taken along the lines VA-VA' and VB-VB', respectively, and illustrate a step following the step shown in FIGS. 5A and 5B. FIGS. 7A and 7B are sectional views of the TFT array panel shown in FIG. 4 taken along the lines VA-VA' and VB-VB', respectively, and illustrate a step following the step shown in FIGS. 6A and 6B. FIG. 8 is a layout view of the TFT array panel in a step following the step shown in FIGS. 7A and 7B. FIGS. 9A and 9B are sectional views of the TFT array panel shown in FIG. 8 taken along the lines IXA-IXA' and IXB-IXB', respectively. FIG. 10 is a layout view of the TFT array panel in a step following the step shown in FIGS. 9A and 9B. FIGS. 11A and 11B are sectional views of the TFT array panel shown in FIG. 10 taken along the lines XIA-XIA' and XIB-XIB', respectively.

As shown in FIGS. 4, 5A and 5B, two conductive films (e.g., film 121p and 121q), a lower conductive film and an upper conductive film, are sputtered in sequence on an insulating substrate 110 such as transparent glass. The lower conductive film may be about 1,000-3,000 Å thick and be made of a material such as Al or an Al alloy. The upper conductive film may be about 500-1,000 Å thick and be made of Mo or an Mo alloy Referring to FIGS. 4, 5A and 5B, the upper conductive film and the lower conductive film are patterned in sequence using a patterned photoresist film as an etch mask to form a plurality of gate lines 121 (including a plurality of gate electrodes 124) and a plurality of storage electrode lines 131. Thereafter, the photoresist etch mask is removed.

Patterning of the upper films 121q and 131q and the lower films 121p and 131p may be performed by wet etching, using an Al etchant, such as an aqueous solution including $CH_3COOH$, $HNO_3$, and $H_3PO_3$, which can etch both Al and Mo to form inclined etch profiles.

Referring to FIGS. 6A and 6B, a gate insulating layer 140, an intrinsic a-Si layer 150, and an extrinsic a-Si layer 160 are sequentially deposited by chemical vapor deposition (CVD) to thicknesses of about 1,500-5,000 Å, about 500-2,000 Å and about 300-600 Å, respectively. A conductive layer 170 is then deposited by sputtering, and a photoresist film with a thickness of about 1-2 microns is coated on the conductive layer 170. The photoresist film is exposed to light through an exposure mask (400) and developed to form features 52 and 54.

The developed features 52 and 54 are portions of the photoresist film of different thicknesses. As shown in FIGS. 6A and 6B, the developed photoresist film defines a plurality of portions, referred herein as the first, second, and third portions. The first portions are located on wire areas A and the second portions are located on channel areas C, indicated by the features of the photoresist film labeled by reference numerals 52 and 54, respectively. The third portions are located on the remaining areas B, where substantially all the photoresist film is removed, thus exposing underlying portions of the conductive layer 170. The thickness ratio of the photoresist film at features 54 and 52 is adjusted depending upon the process conditions in the subsequent process steps. For example, the thickness of the photoresist film at the second portions (i.e., at feature 54) may be equal to or less than half of the thickness of the photoresist film at the first portions (i.e., at feature 52). In one embodiment, the photoresist film thickness at the first portions may be about 4,000 Å or less The different thicknesses of the photoresist film may be obtained by several techniques. For example, the different thicknesses may be achieved by a mask having a slit pattern, a lattice pattern, or a thin film(s) with intermediate transmittance or intermediate thickness at the position where the feature 54 is intended in the photoresist film. When using a slit pattern, it is preferable that the width of the slits or the distance between the slits be smaller than the resolution of a light exposer used for the photolithography.

In an embodiment according to the present invention, as illustrated in FIGS. 6A and 6B, an exposure mask 400 includes light blocking opaque areas 410 corresponding to the wire areas A, translucent areas 420 corresponding to the channel areas C, and transparent areas 430 corresponding to the remaining areas B. The translucent areas 420 on the exposure mask 400 control light transmittance to the channel areas C, by generating phase differences in the range of about −70° to about +70° relative to the incident light, and by limiting the transmittance to a range of 20-40% of the transmittance of the transparent areas 430. The transmittance at the transparent areas 430 is intended to pass most of the incident light. When the photoresist film is exposed and developed using the exposure mask 400, the translucent areas 420 are intended to avoid causing the photoresist film at feature 54 to become too thin (whereby, it may become disconnected or to become too thick, where it does maintains substantially the same thickness as the thickness at feature 52. The photoresist film at feature 54 may be formed with uniform thickness, so as to achieve a reliable and reproducible manufacturing process that permits selectively etching the underlying layers under suitable process conditions.

Next, a series of etching steps using the exposure mask 400 to obtain a plurality of data lines 171, source electrodes 173, drain electrodes 175, as well as ohmic contact stripes 161, which include projections 163, ohmic contact islands 165, and semiconductor stripes 151 with projections 154, are described.

Referring to FIGS. 6A and 6B, as discussed above, portions of the conductive layer 170, the extrinsic a-Si layer 160, and the intrinsic a-Si layer 150 at the wire areas A are referred to as first portions. Portions of the conductive layer 170, the extrinsic a-Si layer 160, and the intrinsic a-Si layer 150 at the channel areas C are referred to as the second portions. Portions of the conductive layer 170, the extrinsic a-Si layer 160, and the intrinsic a-Si layer 150 at the remaining areas B are referred to as the third portions.

A first exemplary sequence of steps for forming the TFT array of the present invention includes:

(1) Removing the conductive layer 170, the extrinsic a-Si layer 160 and the intrinsic a-Si layer 150 of the third portions at the remaining areas B;

(2) Removing the photoresist film at the feature 54;

(3) Removing the conductive layer 170 and the extrinsic a-Si layer 160 of the second portions at the channel areas C; and (4) Removing e the photoresist film at the feature 52.

A second exemplary sequence of steps for forming the TFT array of the present invention includes:

(1) Removing the conductive layer 170 of the third portions;

(2) Remove the photoresist film at the feature 54;

(3) Removing the extrinsic a-Si layer 160 and the intrinsic a-Si layer 150 of the third portions;

(4) Removing the conductive layer 170 of the second portions;

(5) Removing the photoresist film at the feature 52; and (6) Removing the extrinsic a-Si layer 160 of the second portions.

The steps of the second exemplary sequence are now described in detail:

(1) Referring to FIGS. 7A and 7B, following developing the photoresist film to achieve the features 52 and 54, the conductive layer 170 of the third portions at areas B are removed by wet etching or dry etching to expose the underlying extrinsic a-Si layer 160 of the third portions. The Al of conducting layer 170 is preferably wet etched, while the Mo of the conducting layer 170 can be etched either by dry etch or wet etch. In fact, Al and Mo may be simultaneously etched under the same etching conditions. Note that, an upper portion of the photoresist film (i.e., the photoresist film having features 52 and 54) may be removed by a dry etching of conductor layer 170.

In FIGS. 7A and 7B, reference numeral 174 indicates conductors of the conductive layer 170, which form the data lines 171 and the drain electrodes 175 in FIGS. 1-3. As shown in FIG. 7A, the conductors 174 are shown to be over-etched under the photoresist film, thereby resulting in an under-cut profile.

Figure 8A:
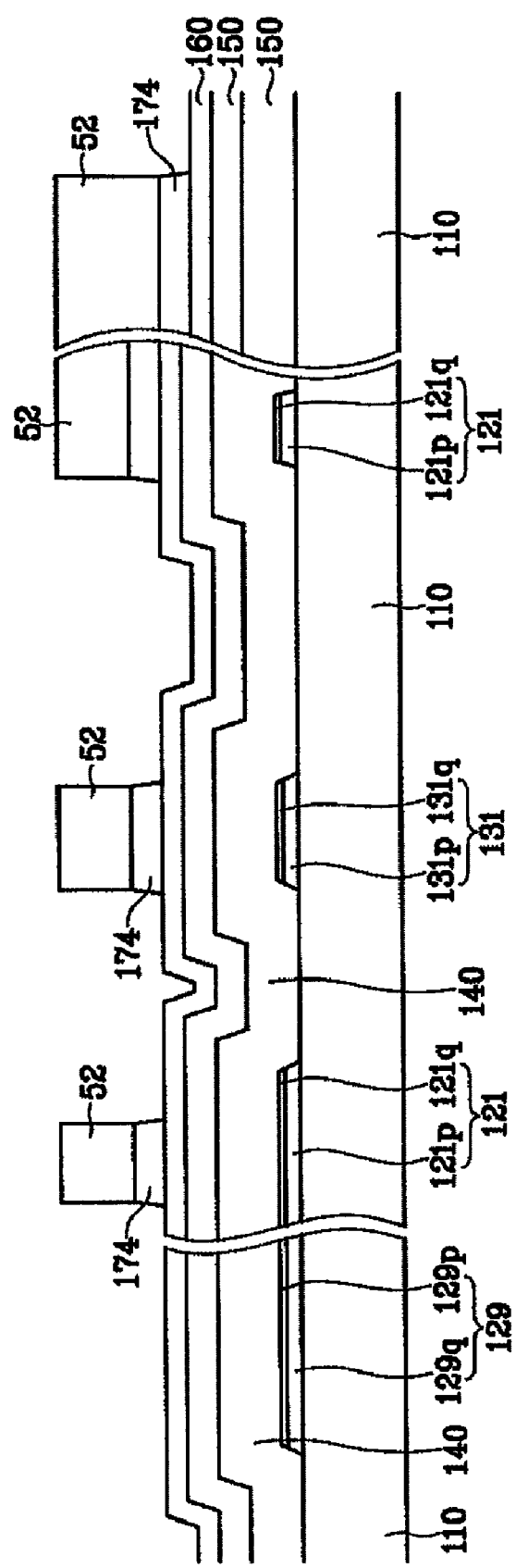
FIGS. 8A and 8B are sectional views of the TFT array panel shown in FIG. 4 taken along the lines VA-VA' and VB-VB', respectively, and illustrate a step following the step shown in FIGS. 7A and 7B.
Figure 8B:
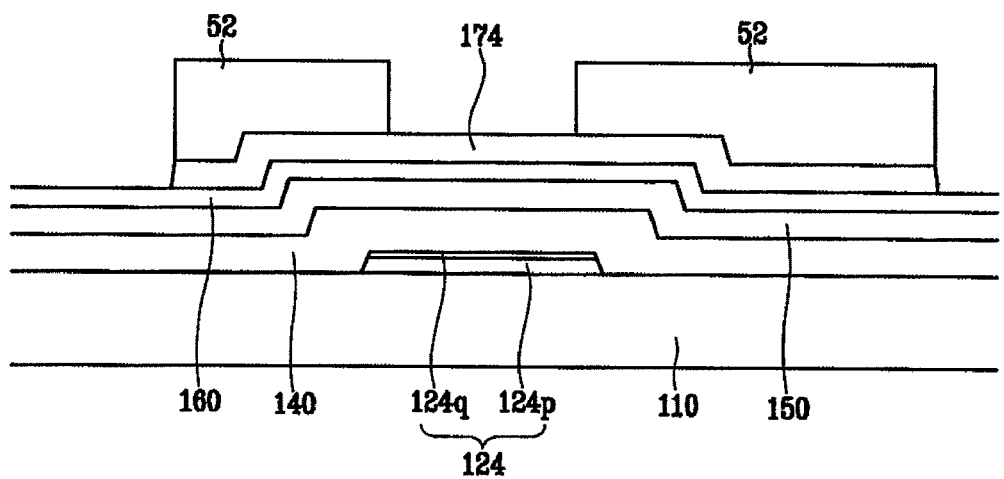

(2) Referring to FIGS. 8A and 8B, an "etch back" process is carried out by ashing, which removes the portion of the photoresist film at feature 54, thereby exposing the conductors layer 174 of the second portions. At the same time, some amount of the exposed portions of the photoresist film at feature 52 is removed, thereby decreasing the thickness of the remaining photoresist film, and eliminating the under-cut structure from the etch of conductor 170 discussed above.

(3) Referring to FIGS. 9A and 9B, the extrinsic a-Si layer 160 and intrinsic a-Si layer 150 of the third portions in areas B are removed, preferably by dry etching. At the same time, the upper portion of the conductor 174 may be also etched, as shown in FIG. 9B, to reduce the subsequent etch time of the conductors 174 in the channel areas C.

The formation of semiconductor stripes 151 is completed in this step, and reference numeral 164 indicates portions of the extrinsic a-Si layer 160, including the ohmic contact stripes 161 and islands 165 (FIGS. 2-3) connected to each other, which are collectively referred to as "extrinsic semiconductor stripes."

(4) Next, the conductors 174 of the second portions are removed.

(5) The extrinsic a-Si stripes 164 are removed.

(6) Then, the photoresist film at the feature 52 is removed. This results in the configuration shown in FIGS. 10, 11A and 11B, where each conductor 174 is now divided into a data line 171 and a plurality of drain electrodes 175, and each extrinsic semiconductor stripe 164 is now divided into an ohmic contact stripe 161 and a plurality of ohmic contact islands 165.

As shown in FIG. 11B, a top portion of the projections 154 of the intrinsic semiconductor stripes 151 may be removed to reduce the channel areas C to a desired thickness.

Figure 12:
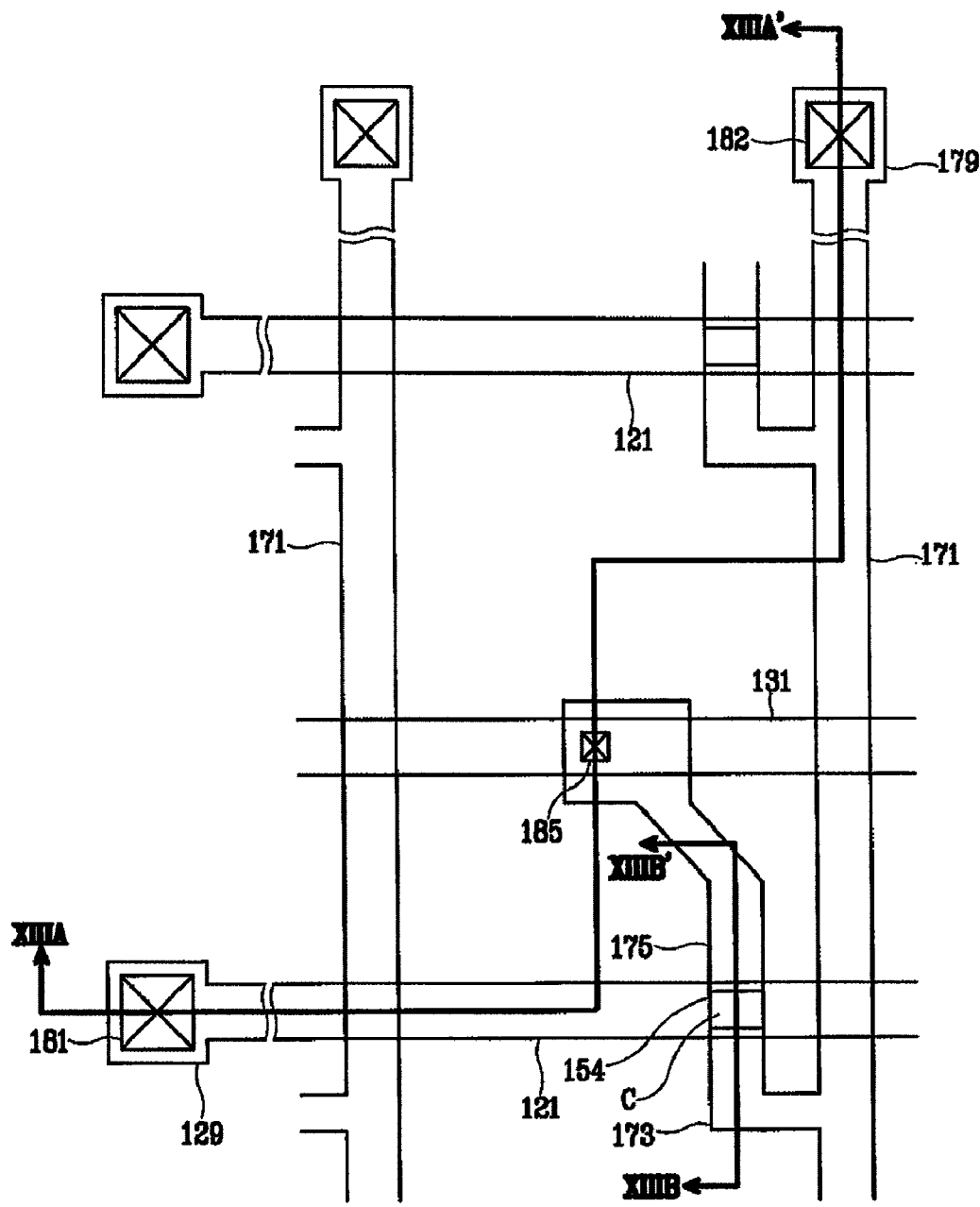
FIG. 12 is a layout view of the TFT array panel in a step following the step shown in FIGS. 11A and 11B.
Figure 13A:
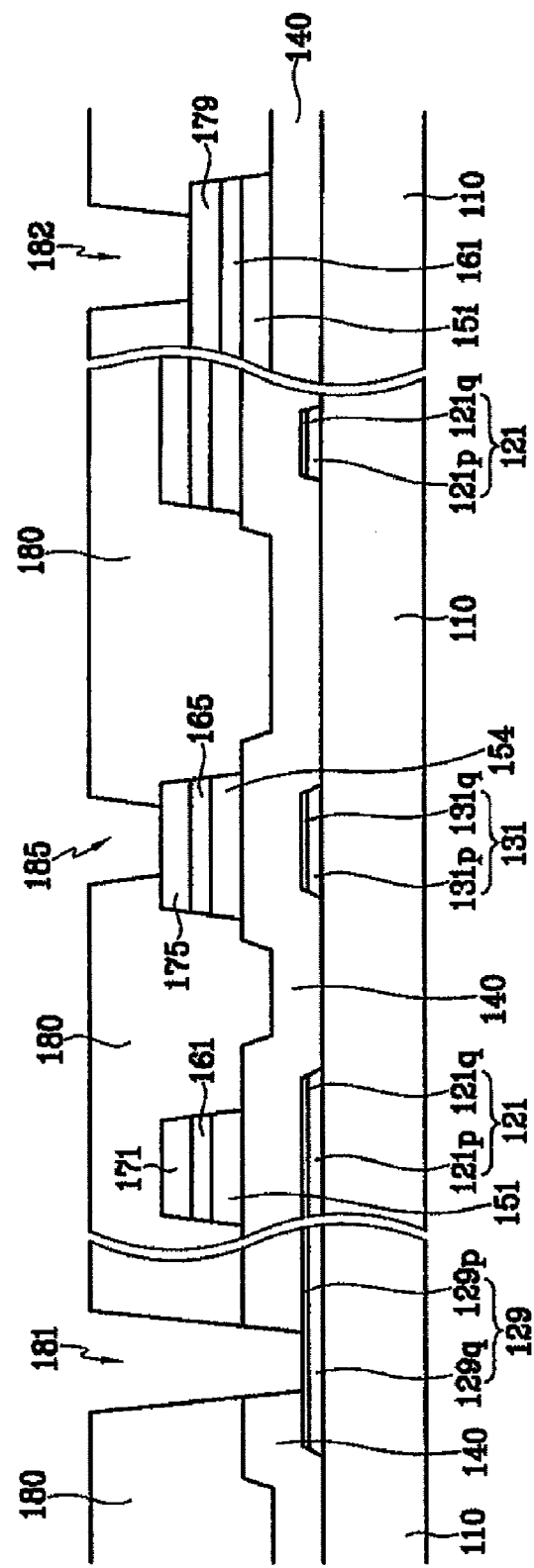
FIGS. 13A and 13B are sectional views of the TFT array panel shown in FIG. 12 taken along the lines XIIIA-XIIIA' and XIIIB-XIIIB', respectively.
Figure 13B:
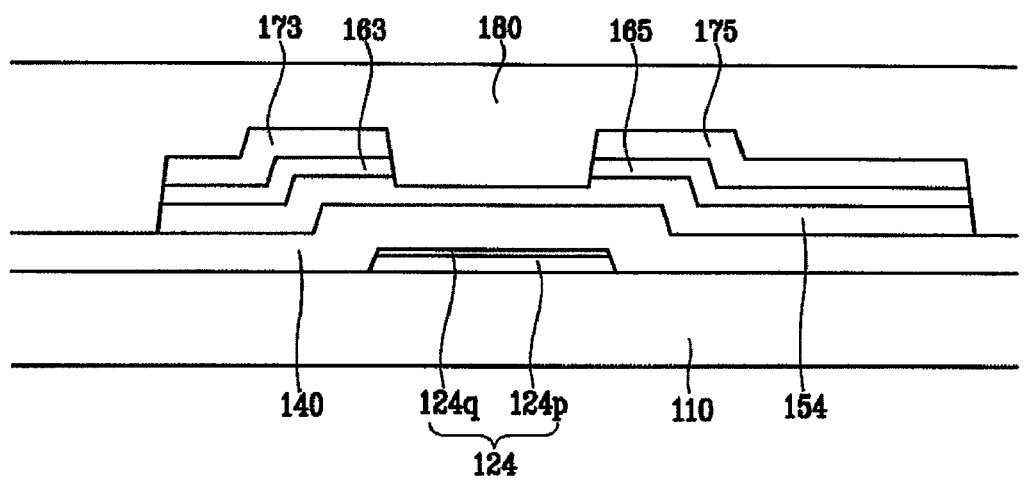

Referring to FIGS. 12, 13A and 13B, a passivation layer 180 is formed by, for example, the CVD of silicon nitride, the coating of an acrylic organic insulating film, or the PECVD of low dielectric insulating material (e.g., a-Si:C:O or a-Si:O:F) of a low dielectric constant. Thereafter, selected portions of the passivation layer 180 and the gate insulating layer 140 are patterned to form a plurality of contact holes 181, 182 and 185.

Finally, as shown in FIGS. 1-3, a plurality of pixel electrodes 190 and a plurality of contact assistants 81 and 82 are formed on the passivation layer 180 by sputtering and patterning an ITO or IZO layer to a thickness of 500-1,500 Å. The etching of the IZO film may be carried out by wet etching using a Cr etchant, such as $HNO_3/(NH_4)_2Ce(NO_3)_6/H_2O$, which does not erode the exposed Al portions of the gate lines 121, the data lines 171, and the drain electrodes 175 through the contact holes 182, 181 and 185.

Since this manufacturing method simultaneously forms the data lines 171, the drain electrodes 175, the semiconductors 151, and the ohmic contacts 161 and 165 using one exposure mask, the manufacturing process of the present invention is simplified relative to the prior art.

Now, the exposure mask according to an embodiment of the present invention is described in detail with reference to the drawings.

Figure 14:
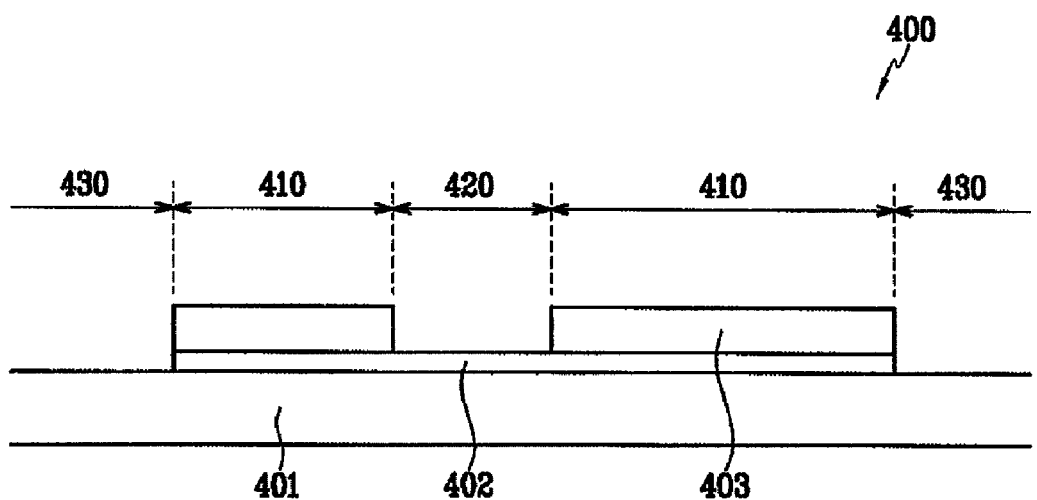
FIG. 14 is a sectional view of a mask according to an embodiment of the present invention.

FIG. 14 is a sectional view of an exposure mask according to an embodiment of the present invention.

Referring to FIG. 14, an exposure mask 400 according to an embodiment of the present invention includes a transparent substrate 401 (e.g., quartz), a translucent layer 402, which is formed in light blocking area 410 and a translucent area 420, and a light blocking layer 403, which is formed only in the light blocking areas 410. When illuminated, a portion of incident light passes through the translucent layer 402, while most of the incident light is blocked by the light blocking layer 403. Most of the incident light passes through transparent area 430, where the light blocking layer 403 and the translucent layer 402 are not present.

To implement the translucent areas 420 of the exposure mask 400 which generate phase differences in the incident light, the exposure mask 400 according to the present invention is a phase shifter mask (PSM). In lithography using the exposure mask 400, the translucent areas 420 generate phase differences in the incident light from about −70° to about +70°, and it is preferable that the transmittance of the translucent areas 420 is in the range of 20-40 percentage of the transmittance of the transparent areas 430 which pass most of the incident light. The phase difference $\Delta\Phi$ generated by the translucent layer is given by $\Delta\Phi=2\pi\times d(n-1)/\lambda$, where d is the thickness of the translucent layer 402, $\lambda$ is the wavelength, and n is the refraction index. The GH light source which emits light with wavelength in the range of about 400-440 nm is suitable for lithography using the exposure mask 400 to expose a photoresist film. The exposure mask 400 may be used in the photolithography process using a KrF light source emitting light with wave length in the range of about 230-260 nm, or an ArF light source emitting light with wavelength in the range of about 180-210 nm.

The thickness of the translucent layer 402 or the transparent substrate 401 may be varied to generate other phase differences. The translucent layer 402 may include a material such as MoSi. The light blocking layer 403 may include opaque material such as chromium. MoSi may be added to the translucent layer 402 further control the phase difference introduced into the incident light. In addition, a plurality of slits, preferably made of opaque material such as chromium, may be arranged in the translucent portion 420 to further control the transmittance of the translucent portion 420.

To form the translucent layer 402, a metal layer is sputtered in a chamber in which an active or an inactive gas is injected. The metal layer includes at least one of Co, Ta, W, Mo, Cr, V, Pd, Ti, Nb, Zn, Hf, Ge, Al, Pt, Mn, Fe and Si. The inactive gas includes at least one of He, Ar, Ne, and Xe, and the active gas includes at least one of O2, N2, CO, CO2, N2O, No, NO2, NH3, and CH4. When the translucent layer 402 includes MoSi, the translucent layer 402 may be made from any one of MoSiN, MoSiO, MoSiC, MoSiCO, MoSiCN, MoSiON, and MoSiCON. In a preferred embodiment, this material comprises about 0-20% C by atomic weight, 0-60% O, 0-60% N, and 20-60% Si, with the remainder being the metal.

In one embodiment of the present invention, the exposure mask 400 having the translucent layer 402 generating phase differences of 50° was manufactured, and a photoresist film was exposed and developed through the translucent portion 420. Phase conflicts are not generated, thereby forming a photoresist film having uniform thickness at the feature 54.

The exposure mask according to the present invention may be used to manufacture a panel for an OLED, a semiconductor device, as well as a panel for an LCD. Also, the shapes and the transmittance of the translucent portion of the exposure mask may be varied, and the exposure mask may be variously adapted for simultaneously patterning different thin films.

As described above, translucent areas generating phase differences in the range from about −70° to +70° of the incident light are provided to control the transmittance of the translucent areas of the exposure mask, thereby forming a photoresist film having a uniform thickness in a reliable and reproducible process.

Furthermore, since the manufacturing method of the TFT array panel according to any one of the illustrative embodiments described above simultaneously forms the different thin films using one exposure mask, the manufacturing process is simplified, thereby minimizing the production cost.

Although preferred embodiments of the present invention have been described in detail above, it should be clearly understood that many variations and/or modifications of the basic inventive concepts herein taught which may appear to those skilled in the present art will still fall within the spirit and scope of the present invention.

What is claimed is:

1. An exposure mask comprising:
   a light blocking opaque area;
   a translucent area; and
   a transparent area;
   wherein the translucent area generates a phase difference in an incident light passing through the transparent area,
   wherein the phase difference is in the range between about −70° to about +70°; and
   wherein the transmittance of the translucent area is about 20 and about 40 percent of the transmittance in the transparent area.

2. The exposure mask of claim 1, wherein the light blocking opaque area is a coated layer of opaque material.

3. The exposure mask of claim 2, wherein the translucent layer includes MoSi.

4. The exposure mask of claim 3, wherein the translucent layer comprises at least one member selected from the group consisting of MoSiN, MoSiO, MoSiC, MoSiCO, MoSiCN, MoSiON, and MoSiCON.

5. The exposure mask of claim 2, wherein the translucent layer includes a plurality of slits that are made of an opaque material.

6. The exposure mask of claim 2, wherein the light blocking opaque layer includes Cr.

7. The exposure mask of claim 2, wherein the translucent layer comprises about 0-20% C, 0-60% O, 0-60% N, and 20-60% Si by atomic weight, with the remainder being metal.

* * * * *